United States Patent
Ansell et al.

(10) Patent No.: US 11,710,670 B2
(45) Date of Patent: Jul. 25, 2023

(54) APPARATUS AND METHOD

(71) Applicant: SPTS Technologies Limited, Gwent (GB)

(72) Inventors: Oliver Ansell, Gwent (GB); Harry Gordon-Moys, Gwent (GB)

(73) Assignee: SPTS Technologies Limited, Newport (GB)

( * ) Notice: Subject to any disclaimer, the term of this patent is extended or adjusted under 35 U.S.C. 154(b) by 43 days.

(21) Appl. No.: 17/000,243

(22) Filed: Aug. 21, 2020

(65) Prior Publication Data

US 2021/0134684 A1 May 6, 2021

(30) Foreign Application Priority Data

Nov. 5, 2019 (GB) ...................................... 1916079

(51) Int. Cl.
| | |
|---|---|
| H01L 21/67 | (2006.01) |
| H01L 21/3065 | (2006.01) |
| H01J 37/32 | (2006.01) |
| H01L 21/66 | (2006.01) |
| H01J 37/22 | (2006.01) |

(52) U.S. Cl.
CPC ............ *H01L 22/26* (2013.01); *H01J 37/222* (2013.01); *H01J 37/228* (2013.01); *H01J 37/32715* (2013.01); *H01L 21/3065* (2013.01); *H01L 21/67069* (2013.01); *H01J 2237/334* (2013.01)

(58) Field of Classification Search
CPC .. H01J 2237/334; H01J 37/222; H01J 37/228; H01J 37/32715; H01J 37/32926; H01J 37/32963; H01J 37/32972; H01J 37/3299; H01L 21/3065; H01L 21/67069; H01L 22/26; H01L 22/12; H01L 22/30; H01L 21/308

USPC .............. 156/345.24, 345.35, 345.4, 345.51, 156/345.52; 438/708, 709, 715
See application file for complete search history.

(56) References Cited

U.S. PATENT DOCUMENTS

| | | | | |
|---|---|---|---|---|
| 4,479,848 A | * | 10/1984 | Otsubo ................. | H01L 21/302 216/60 |
| 5,450,205 A | | 9/1995 | Sawin et al. | |
| 6,448,094 B2 | | 9/2002 | Yamazawa et al. | |
| 7,101,805 B2 | | 9/2006 | Johnson et al. | |

(Continued)

FOREIGN PATENT DOCUMENTS

EP    2592646 A2    5/2013

OTHER PUBLICATIONS

Liddane et al., "New optical sensor for real-time in-situ end point monitoring during dry etching of III-V ternary multistack layers", Proc. SPIE 3882, Process, Equipment, and Materials Control in Integrated Circuit Manufacturing V, Sep. 3, 1999.

(Continued)

*Primary Examiner* — Shamim Ahmed
(74) *Attorney, Agent, or Firm* — Hodgson Russ LLP

(57) ABSTRACT

A white light illumination source can illuminate a region of a substrate to be plasma etched with an incident light beam. A camera takes successive images of the region being illuminated during a plasma etch process. Image processing techniques can be applied to the images so as to identify a location of at least one feature on the substrate and to measure a reflectivity signal at the location. The plasma etch process can be modified in response to the measured reflectivity signal at the location.

20 Claims, 5 Drawing Sheets

(56) References Cited

U.S. PATENT DOCUMENTS

| | | |
|---|---|---|
| 9,640,370 B2 | 5/2017 | Ansell |
| 2005/0020073 A1 | 1/2005 | Perry |
| 2008/0014748 A1 | 1/2008 | Perry |
| 2008/0138993 A1 | 6/2008 | Hiroshima et al. |
| 2015/0311129 A1 | 10/2015 | Miller et al. |
| 2017/0062290 A1* | 3/2017 | Miller ................. H01L 21/3065 |
| 2018/0061691 A1 | 3/2018 | Jain et al. |
| 2018/0259848 A1* | 9/2018 | Grimbergen ............ H01L 22/26 |
| 2018/0261481 A1* | 9/2018 | Eto .................... G01K 11/3213 |
| 2018/0286643 A1* | 10/2018 | Tuitje ..................... H01L 22/26 |

OTHER PUBLICATIONS

UK IPO, Search report for GB1916079.5, dated Aug. 3, 2020.

* cited by examiner

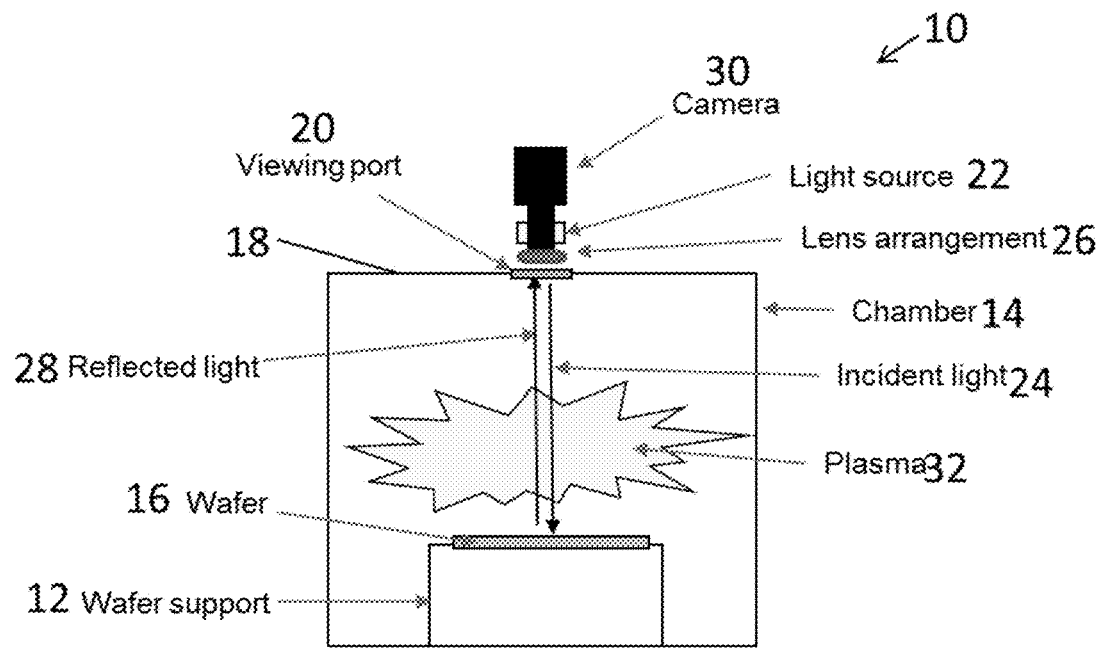
Figure 1
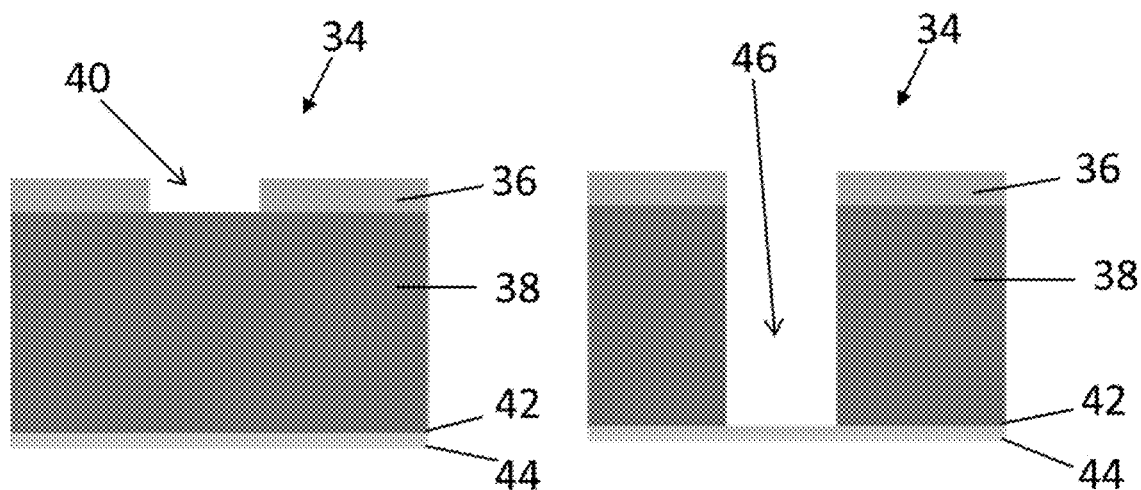
Figure 2A
Figure 2B

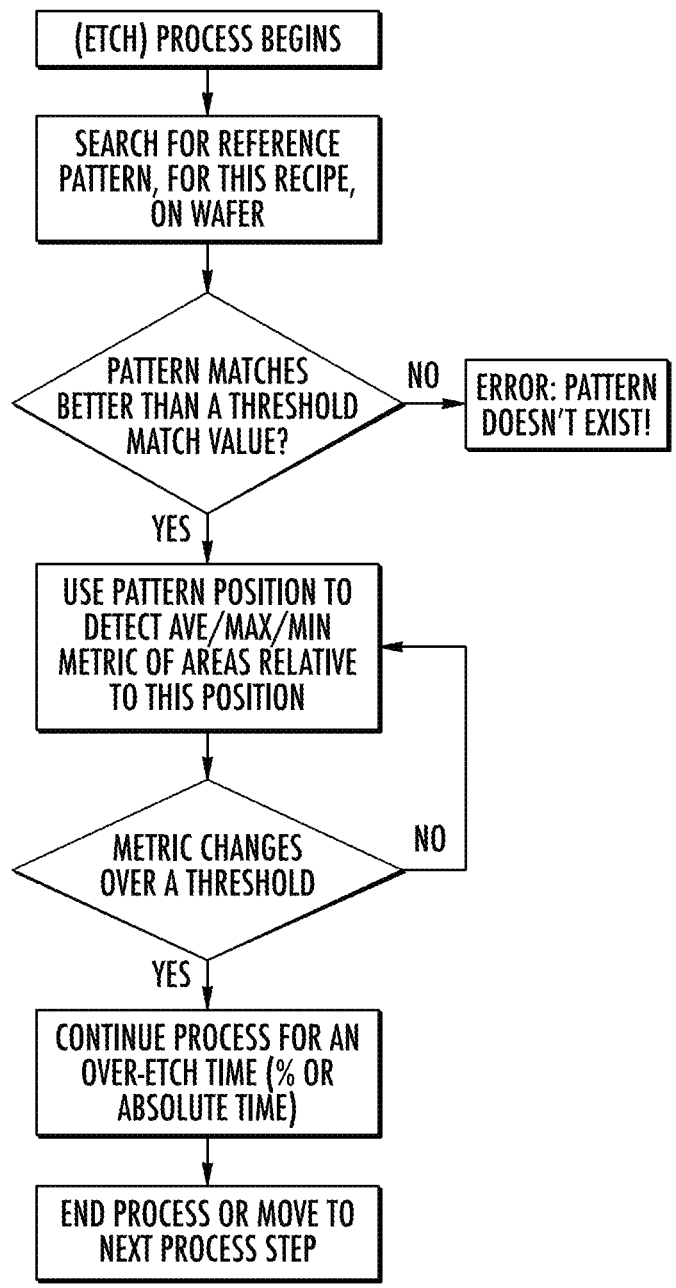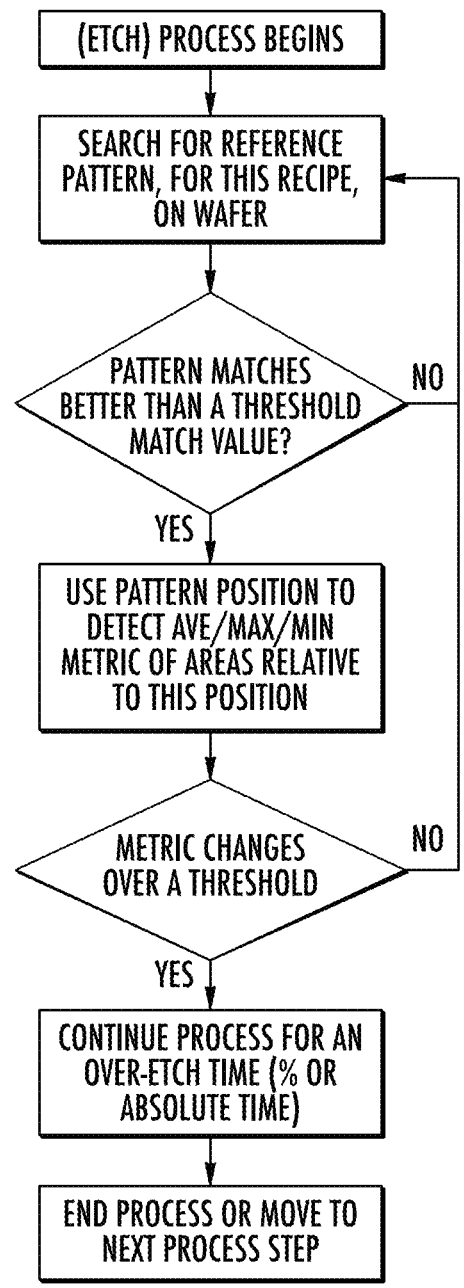
FIG. 7
FIG. 8

APPARATUS AND METHOD

CROSS-REFERENCE TO RELATED APPLICATIONS

This application claims priority to UK Patent Application No. 1916079.5 filed Nov. 5, 2019, the disclosure of which is hereby incorporated by reference.

FIELD OF THE DISCLOSURE

This invention relates to an apparatus for plasma etching a substrate, in particular to etch a feature. This invention also relates to an apparatus for determining an end point of a plasma etch process. This invention also relates to associated methods of plasma etching a substrate; and to associated methods of determining an end point of a plasma etch process.

Plasma etching can be used to etch features in a wafer, such as a silicon wafer. A mask that is resistant to the etching conditions can be provided on the wafer. The surface area of the wafer not covered by the mask (also referred to as the "open area") is exposed to the etching conditions and can be selectively etched.

The termination of plasma etch processing steps can be determined using an end point signal. The end point signal may, for example, be a measured change in the optical properties of the wafer or a change in the optical and/or chemical properties of the plasma. Known methods of determining an end point include laser-based reflectometry, interferometry, and optical emission spectroscopy (OES). However, these techniques are not always well suited to provide a strong end point signal, particularly when the percentage open area in the mask is low (e.g. less than about 1%).

Reflectometry and interferometry techniques depend upon a change in the optical properties of the wafer. The change in optical properties of the wafer may be due to an etch stop layer being reached. Laser-based techniques typically only provide a measurement over the localised area determined by the spot size of the laser. Therefore, the measurements are only representative of a small area (typically covering about one or a small number of features) and might not be truly representative of the wafer as a whole. To obtain a signal, the laser must be accurately positioned and aligned in the region where the features are to be measured, which can be challenging, particularly when the percentage of open areas in the mask is low or when a dimension of the features being etched is less than or similar to the spot size of the laser. If the laser is not aligned correctly, the feature might not be observed and an end point signal might not be detected. Some methods utilise moving parts to enable the entire surface of the wafer to be scanned by the laser. However, these systems add cost and complexity to the manufacture and operation of the apparatus.

OES depends upon a change in the optical properties of the plasma indicative of an end point. However, the OES sensitivity reduces as the percentage of the "open area" in the mask is reduced because the amount of material etched from the wafer is correspondingly low. Consequently, when the percentage of the "open area" of the mask is low, OES may only provide a weak end point signal.

BRIEF SUMMARY OF THE DISCLOSURE

The present invention, in at least some of its embodiments, seeks to address some of the above described problems, desires and needs. The present invention, in at least some of its embodiments, provides an apparatus suitable for determining an etch end point by providing a strong end point signal, even when the fraction of open area of the mask is low (e.g. less than about 1%). The present invention, in at least some embodiments, further provides an end point signal that is representative across a broad area of a substrate. The present invention, in at least some embodiments, can further provide a strong end point signal in the case of high aspect ratio features, or features revealed at the bottom of a trench.

According to a first aspect of the invention there is provided an apparatus for plasma etching a substrate, the apparatus comprising:

a chamber;

a substrate support disposed within the chamber for supporting the substrate to be plasma etched, a white light illumination source for illuminating a region of the substrate during a plasma etch process, wherein the illumination source is mounted to illuminate the region of the substrate with an incident light beam having an angle of incidence of less than about 10° with respect to the normal;

a camera arranged to take successive images of the region illuminated by the illumination source; and a processor configured to perform image processing techniques on the images so as to identify a location of at least one feature on the substrate and to measure a reflectivity signal from the feature at the location;

wherein the processor is configured to modify the plasma etch process in response to the measured reflectivity signal at the location.

The processor can be configured to modify the plasma etch process in response to a change in the measured reflectivity signal at the location.

The illumination source can be mounted to illuminate the region of the substrate with an incident light beam having an angle of incidence of less than about 5° with respect to the normal. Optionally the angle of incidence of the incident light beam is less than about 2°, optionally less than about 1°, or optionally about 0° with respect to the normal. A low angle of incidence allows the bottom of high aspect ratio features to reflect light to the camera (i.e. to be imaged by the camera). Therefore, due to collimation of light in the feature, it is beneficial to position the camera and the light source approximately 90° to the wafer surface. This helps to avoid exposed features being hidden from view, and can therefore improve the strength of the reflectivity signal.

The white light illumination source provides light across a broad optical bandwidth (usually about 100 nm or more) as is known in the art. The white light source can be used to illuminate a broad area of the substrate to be etched. This enables reflectivity signals to be detected across a broad area of the substrate.

The apparatus can further comprise an optical arrangement arranged to focus light emitted by the illumination source onto the substrate. The optical arrangement can also focus light into the camera. The optical arrangement can comprise one or more lenses, and/or optical filters.

The apparatus can further comprise an optical filter positioned to filter selected wavelengths of light entering the camera. An optical filter can be used to preclude certain wavelengths of light, for example certain wavelengths emitted by the plasma, from being detected by the camera. The optical filter can be a bandpass filter.

The camera can be fixed in position so that the field of view of the camera can image a fixed region on the substrate support. In use, the substrate being processed and the camera can be secured in fixed positions relative to each other. Fixing the position of the camera allows corresponding pixels on each successive image to correspond to the same location on the substrate. Therefore, it is possible to monitor the progress of the etch process by analysing these pixels (rather than analysing data across an integrated area of the substrate). Consequently, even though the proportion of open areas in the mask is low, a strong end point signal can still be realised because the measurement. The camera can have a complementary metal-oxide semiconductor (CMOS) detector.

According to a second aspect of the invention there is a method of plasma etching a substrate, the method comprising the steps of:

(a) using a white light illumination source to illuminate a region of the substrate to be plasma etched with an incident light beam having an angle of incidence of less than 10° with respect to the normal;

(b) using a camera to take successive images of the region being illuminated during a plasma etch process;

(c) applying image processing techniques to the images so as to identify a location of at least one feature on the substrate and to measure a reflectivity signal at the location; and (d) modifying the plasma etch process in response to the measured reflectivity signal at the location.

The images taken by the camera have a resolution in which discrete features in the illuminated region can be resolved. That is, the pixel size is typically smaller than the size of the feature being imaged by the camera.

Step (c) can comprise applying image processing techniques to the images so as to identify one or more pixels in the images, wherein the one or more pixels correspond to the location of a feature on the substrate. The reflectivity signal of the one or more pixels can be measured. The reflectivity signal of these pixels is typically associated with the reflectivity signal from the location of the feature. These reflectivity signals can be analysed to measure a value of or a change in the reflectivity signal during the plasma etch process. The plasma etch process can be modified in response to the magnitude of the reflectivity signal of the one or more pixels that correspond to the location of the at least one feature being above or below a pre-determined value. The plasma etch process can be modified in response to a change in the reflectivity signal of the one or more pixels that correspond to the location of the at least one feature.

The plasma etch process can be modified in response to the magnitude of the reflectivity signal at the location being above or below a pre-determined value.

Step (d) can comprise modifying the plasma etch process in response to a change in the measured reflectivity signal at the location.

Analysing specific locations on the substrate, rather than using an integrated signal across the illuminated region, enables localised changes in reflectivity to be detected. This has particular application when the open areas of a mask layer make up less than about 1% of the substrate surface to be etched.

The region being illuminated can have an area in the range of 0.75 to 100 mm$^2$, optionally 1 to 50 mm$^2$, optionally 2 to 25 mm$^2$, or optionally 3 to 5 mm$^2$. The region being illuminated can be large enough to illuminate a location of at least one feature while allowing for tolerances in substrate positioning and alignment. The illumination source can illuminate a region of the substrate comprising a plurality of features.

The region being illuminated can be illuminated with an incident light beam having an angle of incidence of less than 5°, optionally less than 2°, or optionally less than 1°. The incident light beam can be substantially normal to the substrate. A low angle of incidence allows the bottom of high aspect ratio features to reflect light into the camera (i.e. to be imaged by the camera). Therefore, due to collimation of light in the feature, it is beneficial to position the camera and the light source approximately 90° to the wafer surface. This helps to avoid exposed features being hidden from view, and can therefore improve the strength of the reflectivity signal.

The camera can detect light reflected from the substrate at a detection wavelength. Light emitted by the illumination source can have a higher intensity or brightness at the detection wavelength than light emitted by the plasma of the plasma etch process at the detection wavelength. The wavelength the camera is sensitive to can be selected by a user. It is preferable to use a detection wavelength that is different to the wavelength peak at which the plasma emits light so that the signal from the plasma does not saturate the image captured.

The image processing techniques can comprise image pattern recognition and/or image pattern matching. Image pattern matching can be used to counteract vibrations in the plasma etch apparatus, and any relative movement between the camera and the substrate. Image pattern recognition can define and match the open areas of a mask layer prior to etching. Image pattern recognition can comprise image correlation from an existing (e.g. reference) image. Image pattern recognition can comprise finding a reference mark, such as an edge of a die adjacent a dicing or a device design, on the image and calculating a goodness of fit. Other image pattern recognition methods can be contemplated, such as using artificial intelligence and machine learning.

Prior to the plasma etch process, the substrate can comprise a front surface comprising at least two areas having different reflectivity properties.

The substrate can comprise a mask layer partially covering a material to be etched. The mask layer can have a different reflectivity property to the material to be etched. The mask layer can cover at least 90%, optionally at least 95%, or optionally at least about 99% of the material to be etched. That is, the proportion of open areas on the surface of the substrate can be about 10% or less, 5% or less, 2% or less, or about 1% or less. The method can enable a strong end point signal to be provided even when the proportion of open areas on the substrate is very low.

Step (c) can comprise applying image processing techniques to a reference image (e.g. a first image) taken by the camera to identify the location of the at least one feature. The image processing techniques can comprise measuring a reference reflectivity signal, for example at the location of the at least one feature in the reference image. The image processing techniques can comprise comparing the reference reflectivity signal with a reflectivity signal measured at the location of the at least one feature on successive images. Step (c) can comprise measuring the change in the reflectivity signal at the location of the at least one feature by comparison with the reference image. For example, the reflectivity signal from the location in the reference image can be compared with the reflectivity signal from the location in a subsequent image. As another example, the reflectivity signal from the location of the feature in one (successive) image can be compared with a reference value, such as the reflectivity signal from a location not associated with a feature (e.g. part of a mask layer).

Identifying the location of the at least one feature can comprise locating a reference pattern. The location of the at least one feature can be identified relative to the location of the reference pattern.

The reflectivity signal can be a brightness signal, an intensity, and/or a colour of reflected light. The change in the reflectivity signal can be a change in brightness signal, an intensity and/or a colour change. For example, the change in reflectivity signal can be a change in light intensity at the detection wavelength. Step (d) can comprise terminating the plasma etch process in response to a change in the reflectivity signal at the location. The change in the reflectivity signal at the location can be correlated to an etch stop signal.

The at least one feature (e.g. a via being etched) typically has a different reflectivity property compared to another area of the substrate that is not associated with the feature (e.g. the mask layer). For example, where the feature is an open area of a mask layer, the open area can have different reflectivity properties compared to the mask layer. This allows the location of the feature to be identified using reflectivity alone. The at least one feature can be a via. The at least one feature can be a trench, such as a trench opening in a mask layer. The feature can be a copper plug embedded in a substrate, such as a silicon substrate.

The substrate can comprise an etch stop layer, such as a GaAs layer. The etch stop layer typically has a different reflectivity property compared to the material being etched (e.g. the feature) and/or another area on the substrate not associated with the feature (e.g. a mask layer). The change in the reflectivity signal at the location can be a result of approaching or exposing a part of the etch stop layer. This change can be indicative of an etch stop signal.

The substrate can be a wafer, a wafer on a carrier structure, or a wafer attached by tape to a frame. The substrate can be a semiconductor wafer, such as a silicon or silicon carbide wafer. That is, the material to be etched can be a semiconductor material, such as silicon or silicon carbide.

Whilst the invention has been described above, it extends to any inventive combination of the features set out above, or in the following description, drawings or claims. For example, any features disclosed in relation to the first aspect of the invention may be combined with any features of the third aspect of the invention.

DESCRIPTION OF THE DRAWINGS

Embodiments of substrates and methods in accordance with the invention will now be described with reference to the accompanying drawings, in which:

FIG. 1 is a schematic view of an apparatus according to an embodiment of the invention;

FIG. 2A is a cross-sectional representation of a feature in a substrate prior to plasma etching;

FIG. 2B is a cross-sectional representation of a feature in a substrate after plasma etching;

FIGS. 5 to 8 are flow diagrams of processes according to embodiments of the invention.

DETAILED DESCRIPTION OF THE DISCLOSURE

Figure 3:
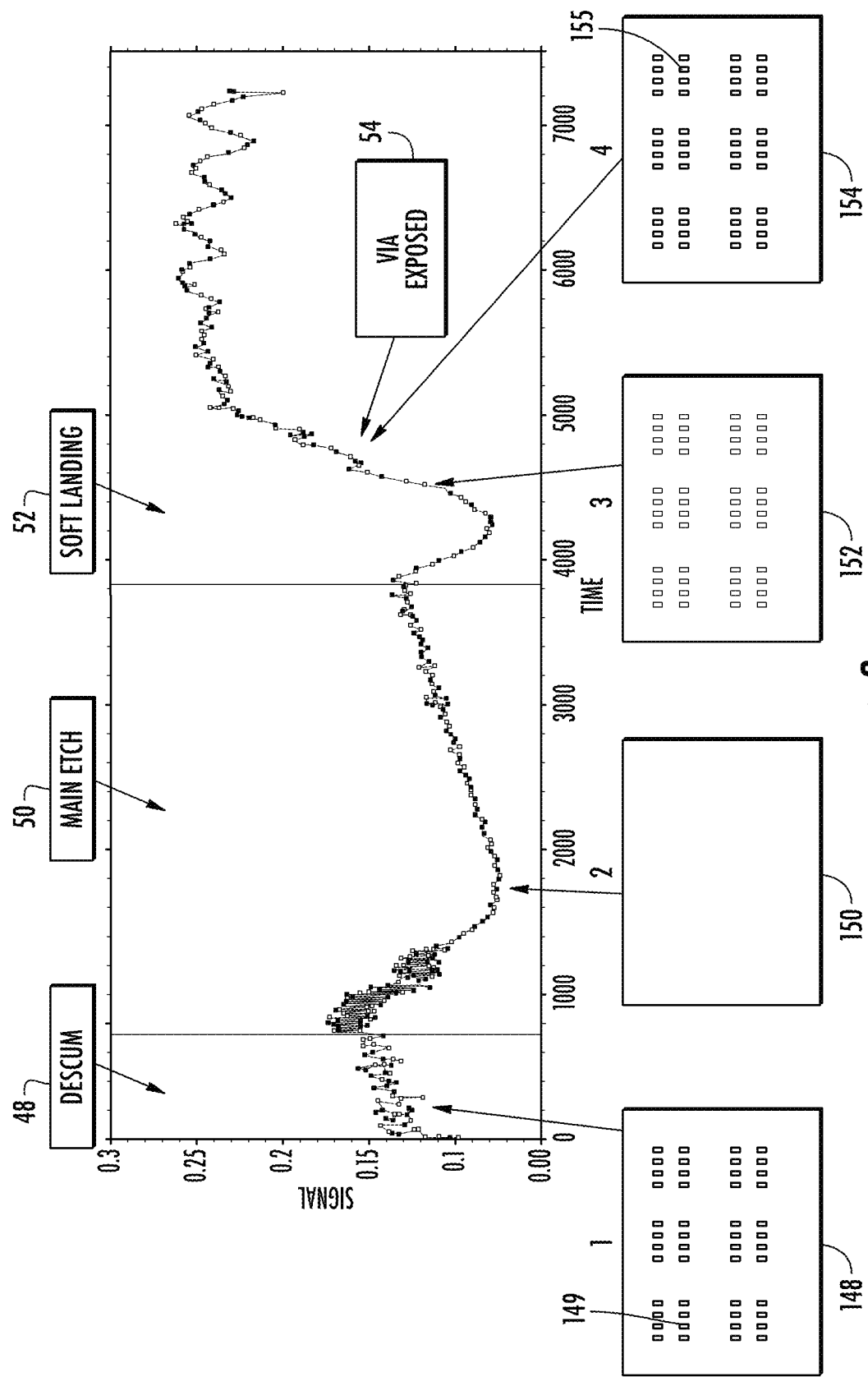
FIG. 3 is a plot showing images of a region of a substrate overlaid with a laser reflectometry trace for comparison.

FIG. 1 shows a schematic view of a plasma etch apparatus, shown generally at 10. Some well-known features of the plasma etch apparatus 10, for example, plasma generation means and gas inlets/outlets, have been omitted from the figure for the sake of simplicity. The operation of generating a plasma within such a plasma etch chamber is well-known in the art and will not be described here other than where necessary for an understanding of the present invention.

The apparatus 10 comprises a substrate support 12 which is disposed within a chamber 14. The chamber 14 is suitable for containing a plasma 32. The substrate support 12 is adapted to hold a substrate 16 in a substantially horizontal orientation, with a front face of the substrate 16 to be etched facing upwards. The substrate 16 can be, for example, a wafer, a wafer on a carrier structure, or a wafer attached by tape to a frame. The substrate 16 can, for example, comprise a plurality of die separated by dicing lanes. A part of the front face of the substrate 16 can be patterned with a mask layer that is resistant to the plasma processing conditions. The parts of the substrate covered by the mask are not etched. On the other hand, the parts of the substrate 16 that remain exposed to the plasma processing conditions (also referred to as "open areas") will be selectively etched during a plasma etch process.

The chamber 14 comprises a top wall 18 (or lid) that is above and faces the substrate support. A window (or viewing port) 20 is arranged in the top wall 18 to be above the substrate support 12 so that at least a portion of the substrate support 12 can be viewed in plan view through the window 20.

A white light illumination source 22 is arranged to illuminate a region of the substrate 16 via the window 20 with an incident light beam 24. The white light illumination source 22 provides light across a broad optical bandwidth (usually about 100 nm or more) as is known in the art. The region of the substrate 16 illuminated by the illumination source 22 is determined by the spot size of the incident light beam 24. The spot size can have a diameter of about 2 mm, or about 5 mm. The spot size is larger than the size of individual features being etched on the substrate. The spot size is large enough to illuminate a region of the substrate 16 that comprises a plurality of features. A feature to be etched typically has different reflectivity properties compared to another area of the substrate that is not associated with the feature. By way of example only, the feature can be an opening in the mask which is used to form a trench or a via in the material being etched. The mask and the opening have different reflectivity properties, which results in the opening exhibiting a different reflectivity signal compared to the mask. Therefore, the open areas are visible prior to the plasma etch process. Buried features, such as copper plugs, are embedded in the substrate and may not be visible at the start of the etch process. However these features will appear as the silicon is etched back to expose the buried features (e.g. copper plugs).

When the open area is etched it will typically be etched to stop at an etch stop layer. Alternatively, the etch can be timed however this may result in a less uniform etch depth control. Exposing the etch stop layer at the bottom of a feature can be an indication that an etch step is complete (e.g. a trench or via feature is fully formed). For example, the etch stop layer may have different reflectivity properties compared to the material being etched and/or a location on the substrate not associated with the feature (e.g. a mask layer or the bulk substrate material). In another example, a reference pattern can be used to identify a known location on the substrate, and the location of the features can be determined in relation to the location of the reference pattern. The feature typically has a dimension of less than about 100 μm.

The incident light beam is focussed and the spot size controlled using optics 26. Optics 26 may comprise one or more lenses for focussing the light beam. The optics 26 may further comprise an optical filter which only allows certain wavelengths of light to pass through.

The incident light beam 24 is reflected from the front face of the substrate 16 to provide a reflected light beam 28. The incident light beam is directed to illuminate the bottom of etched features, such as trenches, so that the reflected light beam 28 comprises a reflectivity signal from the location of the feature. It is preferable for the incident light beam to be substantially normal (i.e. about 90°) to the substrate surface. This helps resolve and view high aspect ratio features, such as high aspect ratio trenches, because a higher proportion of the incident light can reflect off the bottom of the high aspect ratio features. However, a larger angle of incidence may be used for lower aspect ratio features.

A camera 30 is positioned to detect the reflected light beam 28. The camera 30 is mounted in a fixed position relative to the substrate support 12. The reflected light beam 28 may pass through optics 26 and/or through a filter (not shown) prior to entering the lens of the camera 30. The filter can determine which wavelengths of light are detected by the camera 30. The camera 30 can be a CMOS camera. However, other cameras, such as a CCD camera, can also be used.

The camera 30 has a field of view that can substantially correspond to the illuminated region on the substrate. Optionally, the field of view can be smaller or larger than the illuminated region of the substrate. The camera 30 is operable to capture the reflected light from the illuminated region and take successive images of the illuminated region of the substrate during a plasma etch process. The illumination source illuminates a relatively large area of the substrate, and is large enough to include a plurality of locations in which features are present. The illuminated region is also relatively large in comparison to the size of the features being etched. Typically, the image size (and hence the illuminated region) is large enough to include at least one feature to be etched whilst allowing for tolerances in substrate position and alignment. The camera 30 can detect the reflected light 28 from the features being etched.

The camera 30 is focussed so that each pixel in the captured image corresponds to a dimension that is less than a dimension of a feature being etched. Individual features can be resolved in the image taken by the camera. For example, the feature being etched may have a dimension of about 25 μm, whereas each pixel in the first image may correspond to approximately 10 μm×10 μm. Therefore, a location of a feature being etched may span one or more pixels in the captured image. Each pixel contains information concerning a reflectivity signal at a specific location. For example, a pixel can include information on the intensity and/or colour of the reflected light beam at a particular location on the substrate.

An image taken by the camera 30 is transferred to a processor for image processing. Image processing techniques, such as image pattern matching and image pattern recognition, are applied to the images. Image processing techniques can be applied using commercially available software, such as Cognex VisionPro (RTM) sold by Cognex Corporation (Natick, Mass., USA). The pixels in the images that correspond to the location of the features are identified. The reflectivity signals of these pixels can be analysed. If there is a change beyond a threshold value in the reflectivity signal at the location of the features, the processor can send a signal to modify the plasma etch process. For example, the plasma etch process may be stopped, or a next stage of the plasma process may be initiated.

Each successive image taken by the camera is focussed on the same region of the substrate. Consequently, corresponding pixels in successive images contain reflectivity information about the same location on the substrate. Therefore, once the locations of the features have been determined, the reflectivity signals from other locations (e.g. using other pixels) need not be used to analyse the progress of the etch process. Instead, changes which occur in the pixels that correspond to the locations of the features can be analysed to indicate the progress of the etch process. Therefore, when a feature is exposed (e.g. etch stop layer is revealed), a strong end point signal can be determined irrespective of the proportion of open areas in the mask layer.

Example 1

By way of example only, FIG. 2A shows a cross-sectional schematic of an exemplar substrate 34 prior to plasma etching. The substrate 34 comprises a mask layer 36 partially covering a bulk silicon carbide (SiC) layer 38. The SiC layer 38 has a thickness of approximately 100 μm. The mask layer is made from copper having a thickness of about 5 μm. The proportion of open areas 40 in the mask layer is about 0.2%. The substrate 34 further comprises a gallium arsenide (GaAs) layer 42 formed on a gold layer 44, which acts as an etch stop layer. The reflectivity properties of the SiC layer are different to the GaAs stop layer at certain wavelengths of light. The reflectivity properties of the SiC layer are different to the mask layer at certain wavelengths. The reflectivity properties of the GaAs stop layer are different to the mask layer at certain wavelengths.

A white light illumination source illuminated a region of the substrate. A CMOS camera was used to take images of the illuminated region. The image covered an area on the substrate having dimensions of about 2×2 mm. Each pixel corresponded to an area on the substrate having dimensions of about 10×10 μm. A green filter with a 10 nm bandwidth was used to filter the light entering the camera.

The etch end point was determined using apparatus and methods according to embodiments of the invention described above. FIG. 2B is a cross-sectional schematic of the substrate 34 at the etch end point. The GaAs etch stop layer 42 is exposed, and the via 46 is fully formed.

As a comparative example, the etch end point was also determined using a known laser reflectometry and interferometry system with a 25 μm laser spot size. The laser beam had a similar dimension to the feature being etched. Alignment of a laser beam having a similar dimension to the feature being etched can be challenging because a small amount of movement in the substrate can result in misalignment of the laser, which results in a poor measurement or no measurement at all. This will require re-alignment of the substrate or laser, which is time consuming.

FIG. 3 shows the laser reflectometry trace, the intensity of the reflected (laser) signal as a function of time during the etch process, of the comparative example. FIG. 3 also includes four camera images obtained using embodiments of the present invention during the plasma etch. FIG. 3 includes four representative images taken by the camera. Although not shown, a larger number of images were taken by the camera during the etch process. The frequency and number of images taken by the camera during the etch process can be chosen depending on the processing power available.

The plasma etch process was carried out in three steps. The first step is a de-scum step 48. The de-scum step prepares the open areas 40 of the mask for the subsequent etch process, for example, by removing unwanted material from the open areas 40 prior to bulk etching. Image 148 is a camera image captured 300 s after the start of the etch process. Since the exposed SiC layer 36 has a different reflectivity property to the mask layer 34, the locations of the features to be etched are visible as an array of, in this instance, lighter coloured pixels 149 and can be identified.

The second step is a main bulk etch step 50. This includes selectively etching a major portion of the SiC layer at the location of the open area 40. The bulk etch can use any process conditions known in the art. Image 152 is a camera image captured 1800 s from the start of the etch process, and taken during the main etch step 50. The reflectivity signal at the location of the features 149 is degraded and the open areas in the mask are no longer visible. Without wishing to be bound by any theory or conjecture, it is believed that, during the bulk etch step, the surface of the substrate becomes rough or curved so that the reflectivity signal from the features is temporarily degraded.

The third step is a soft landing step 52, in which the etch rate of the landing step is less than the etch rate for the bulk etch step 50. The soft landing step 52 exhibits improved etch selectivity between the SiC layer 38 and the GaAs etch stop layer 42. This helps to ensure that the formation of each etched feature (e.g. via) is complete across the entirety of the substrate 34 (i.e. no SiC material is residual in the via), and therefore helps to improve the etch uniformity across the entirety of the substrate 34. Image 152 is a camera image captured about 4500 s after the start of the etch process, and was taken during the soft-landing step 52. As the SiC layer is thinned, the reflectivity properties of this layer vary. Therefore, as the etch-front approaches the etch stop layer 42, there is a change in the reflectivity signal detected by the camera at the discrete locations in which the features reside, and the discrete locations of the features becomes observable again.

A change in the reflectivity signal (e.g. a change in brightness, intensity, and/or colour) at the locations of the features beyond a threshold value is indicative of the etch stop layer (or a via) being exposed. That is, it is indicative of the plasma etch process being complete. Image 154 is a camera image captured at about 4800 s after the start of the etch process, in which the buried features 155 are visible and the etch process is complete.

Embodiments of the invention provide measurements that are in good agreement with the comparative reflectometry trace. However, the present embodiments have a number of advantages. Firstly, it is simpler to align and focus the incident light beam to ensure that features to be etched are illuminated, in particular whilst allowing for tolerance in the wafer positioning apparatus. This can help to avoid time-consuming substrate re-alignment steps. Secondly, since the reflectivity signals from discrete features are obtained and analysed (rather than integrating a signal over the whole illuminated region), it is possible to detect a strong end point signal irrespective of the proportion of open areas in a mask. For example, embodiments of this invention have particular application in detecting end point signals in substrates having an low open areas (e.g. less than about 1%). Further still, due to the wide field of view of the camera, the data that is processed provides a better representation of the progress of the plasma etch across a wider area of the substrate.

Example 2

Figure 4A:
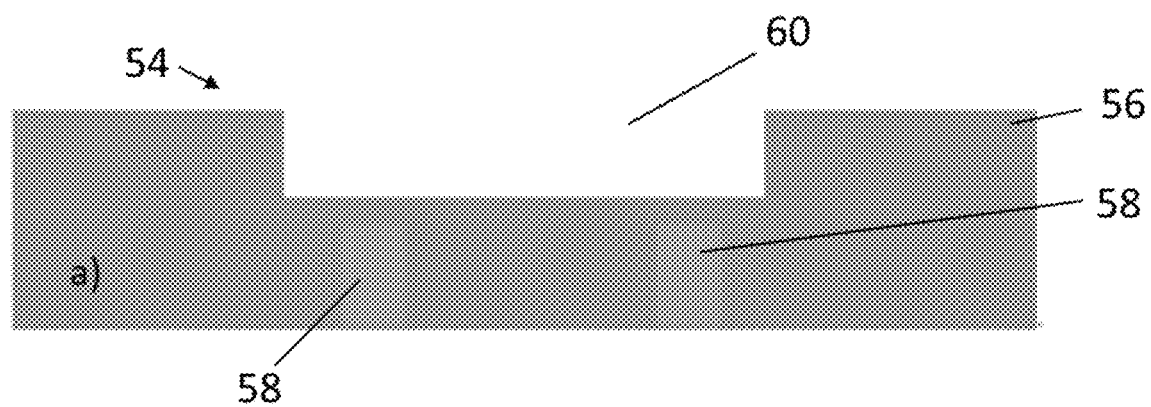
FIG. 4A is a cross-sectional representation of a buried feature in a substrate prior to plasma etching.
Figure 4B:
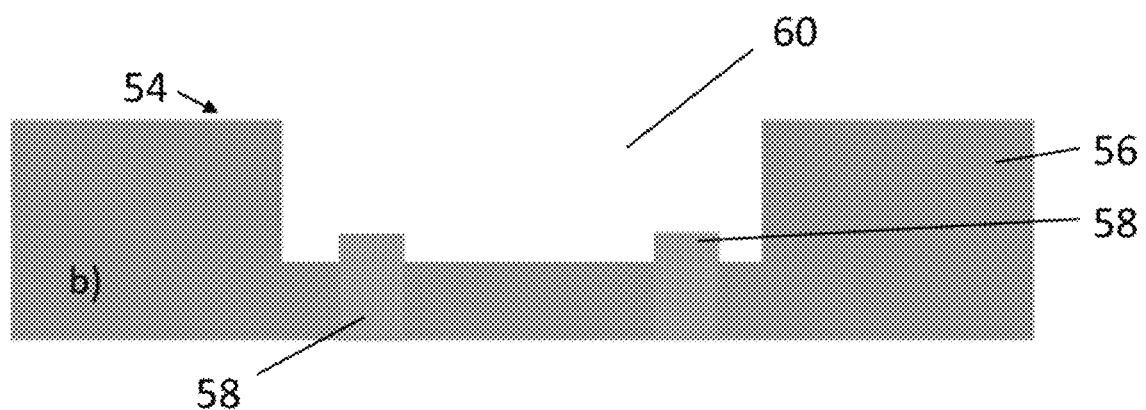
FIG. 4B is a cross-sectional representation of a revealed feature in a substrate after plasma etching.

FIG. 4A shows a cross-sectional schematic view of an exemplar silicon substrate 56 prior to plasma etching. The substrate 56 does not comprise a mask layer. However, the substrate 56 comprises two buried features 58 in a trench 60. The buried features 58 are copper through silicon via (TSV) plugs which are typically encapsulated in a thin dielectric layer such as $SiO_2$.

A region of the substrate is illuminated by the illumination source and the camera takes successive images of the illuminated region during a plasma etch process. The illumination source is positioned to direct an incident beam of light substantially normal to the surface of the substrate 54, as shown by the arrow in FIG. 4A. A very low angle of incidence (i.e. with respect to the normal) is preferred to ensure the incident light beam can reflect off substantially the full area of the bottom surface of the trench. If the angle of incidence is higher, some parts of the bottom of the trench may be hidden from view, and therefore cannot provide any reflectivity information to the camera.

At the start of an etch process the buried features are not visible, and it may not be possible to determine their location within the substrate 56. The camera takes successive images of the illuminated region during the plasma etch process. Processing techniques scan the image for changes in reflectivity signals across the wafer. If the change in reflectivity signal at a location changes beyond a threshold value the processor can initiate a change to the etch process in response. For example, the etch process can be stopped in response to a change in the reflectivity signal (e.g. a change in brightness, intensity, and/or colour) at a specific location.

Example 3

Figure 5:
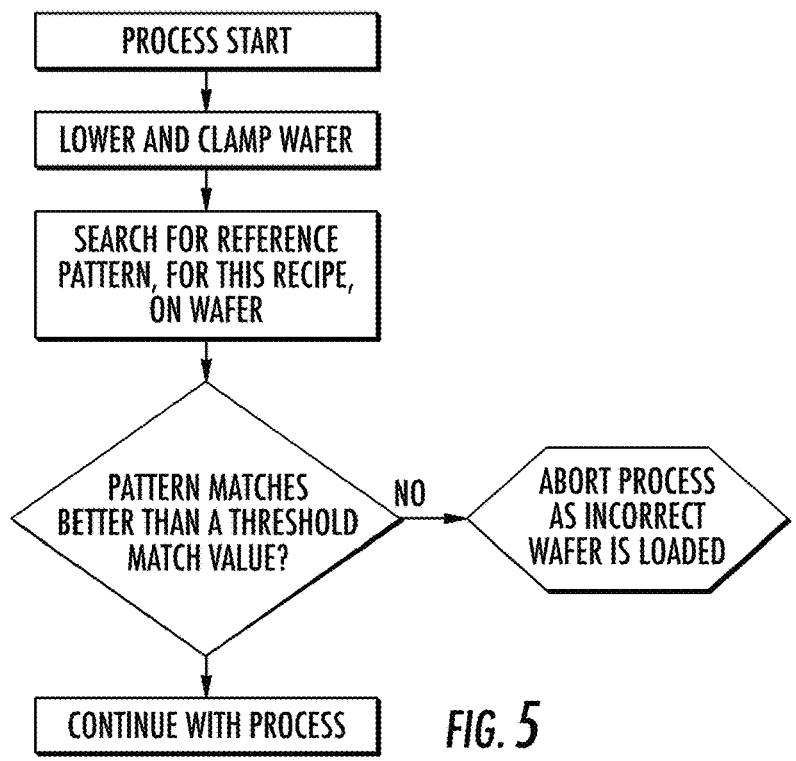

FIG. 5 is a flow diagram of a substrate verification method. A substrate to be etched is positioned on a substrate support and is clamped into position. The substrate to be etched comprises a visible reference pattern, for example a pattern of open areas in a mask layer. A region of the substrate that comprises the reference pattern is illuminated by the illumination source, and the camera takes an image of the illuminated region. The processor uses image pattern recognition and/or image pattern matching techniques to identify the reference pattern. If the reference pattern is present, the correct substrate has been verified and the next stage of the substrate processing can proceed. If the reference pattern is absent, the incorrect substrate has been loaded into the apparatus and the process can be aborted.

Example 4

Figure 6:
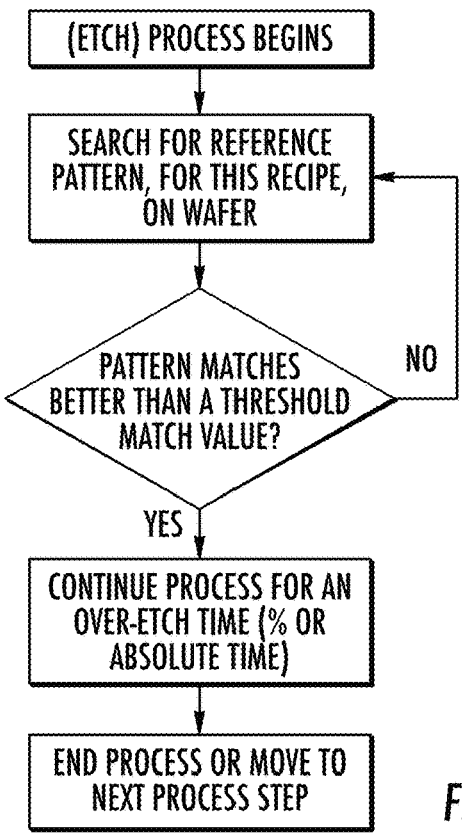

FIG. 6 is a flow diagram of a substrate verification method. This method can also be used to determine an etch end point. A substrate to be etched is positioned and clamped in the same way as example 3. The substrate to be etched comprises a buried reference pattern, such as a buried feature, so that the pattern emerges as the etch progresses. A region of the substrate is illuminated by the illumination source and the camera takes successive images of the illuminated region. A plasma is generated in the chamber, and the plasma etch process begins. The processor uses image pattern recognition or image pattern matching to identify the reference pattern (e.g. buried feature) as the reference pattern is revealed during the process. When the change in reflectivity signal at the location of the reference pattern changes beyond a threshold value, the processor modifies the plasma etch process. This change is indicative of an end point signal. For example, in response to the change in reflectivity signal at the location of the reference pattern the processor can initiate an over-etch process for an absolute over-etch time or as a percentage of the time required to reach the end point signal. The etch process can then be stopped or progressed to the next step in the etch process.

Example 5

FIG. 7 is a flow diagram showing an end-point determination method. A substrate to be etched (comprising a mask layer) is positioned and clamped in the same way as Example 3. The substrate to be etched comprises a visible reference pattern, for example an edge of a die adjacent a dicing lane. The visible reference pattern can be a pattern of open areas in a mask layer. A region of the substrate is illuminated by the illumination source and the camera takes successive images of the illuminated region. The processor uses image pattern recognition or image pattern matching techniques to identify the reference pattern. If the reference pattern is absent, the processor will detect that the incorrect substrate has been loaded into the apparatus and the process can be aborted.

The reference pattern is in a known location on the substrate. The location of features to be etched can be identified relative to the location of the reference pattern. When the locations of the features to be etched are identified, these locations are analysed to determine when a reflectivity signal at these discrete locations changes above a threshold value. The change in reflectivity signal at the locations of the features can be measured with respect to a first reference image. An end point signal is detected when the reflectivity signal changes beyond a threshold value.

The processor can modify the plasma etch process in response to change in reflectivity signal detected at the location of the features. For example, the processor can initiate an over etch process before terminating or changing the etch process in the same way as described for Example 4. Alternatively, the etch process can be terminated or progressed to the next stage of the process immediately.

Example 6

FIG. 8 is a flow diagram showing an end-point determination method. A substrate to be etched is positioned and clamped in the same way as Example 3. The substrate with mask is plasma etched until an etch stop layer is reached. During the plasma etch process, a region of the substrate is illuminated by the illumination source and the camera takes successive images of the illuminated region.

The processor uses image pattern recognition or image pattern matching to identify the location of a reference pattern as it is revealed during the plasma etch process. The location of the features to be etched can be identified relative to the location of the reference pattern. When the locations of the features to be etched are identified, these locations are analysed to determine when a reflectivity signal at these locations changes indicative of an end point signal. In this example, the reflectivity signal is a brightness level.

The processor can modify the plasma etch process in response to the change in reflectivity signal detected at the discrete locations of the features in the same way as for Example 5.

What is claimed is:

1. An apparatus for plasma etching a substrate, the apparatus comprising:
   a chamber;
   a substrate support disposed within the chamber having a support surface for supporting the substrate to be plasma etched,
   a white light illumination source for illuminating a region of the substrate during a plasma etch process, wherein the illumination source is mounted to illuminate the region of the substrate with an incident light beam having an angle of incidence of less than about 10° with respect to normal of the support surface of the substrate support;
   a camera arranged to take successive images of the region illuminated by the illumination source, wherein the white light illumination source and the camera are disposed opposite the chamber from the support surface thereby facing the support surface, and wherein light received by the camera is all illuminated on the region of the substrate with the angle of incidence; and
   a processor configured to perform image processing techniques on the images so as to identify one or more pixels in the images that correspond to a location of at least one feature on the substrate and to measure a reflectivity signal from the one or more pixels, wherein the processor is configured to modify the plasma etch process in response to the measured reflectivity signal at the location, and wherein the one or more pixels have an area smaller than a size of the feature on the substrate.

2. The apparatus according to claim 1, wherein the processor is configured to modify the plasma etch process in response to a change in the measured reflectivity signal at the location.

3. The apparatus according to claim 1, wherein the angle of incidence is less than about 5° with respect to the normal of the surface of the substrate support.

4. The apparatus according to claim 1, further comprising an optical arrangement arranged to focus light emitted by the illumination source onto the substrate and/or into the camera.

5. The apparatus according to claim 1, further comprising an optical filter positioned to filter selected wavelengths of light entering the camera.

6. The apparatus according to claim 1, wherein the image processing techniques comprise image pattern recognition and/or image pattern matching.

7. A method of plasma etching a substrate, the method comprising the steps of:
   (a) using a white light illumination source to illuminate a region of the substrate to be plasma etched with an incident light beam, wherein all light used to illuminate the region of the substrate has an angle of incidence of less than 10° with respect to normal of a front surface of the substrate;
   (b) using a camera to take successive images of the region being illuminated during a plasma etch process;
   (c) applying image processing techniques to the images so as to identify one or more pixels in the images that correspond to a location of at least one feature on the substrate and to measure a reflectivity signal at the one or more pixels, wherein the one or more pixels have an area smaller than a size of the feature on the substrate; and
   (d) modifying the plasma etch process in response to the measured reflectivity signal at the location.

8. The method according to claim 7, wherein the region being illuminated has an area in the range of 0.75 to 100 mm$^2$.

9. The method according to claim 7, wherein the angle of incidence is less than 5° with respect to the normal of the front surface of the substrate.

10. The method according to claim 7, wherein the incident light beam is substantially normal to the front surface of the substrate.

11. The method according to claim 7, wherein the camera detects light reflected from the substrate at a detection wavelength, and light emitted by the illumination source has a higher intensity at the detection wavelength than light emitted by the plasma of the plasma etch process at the detection wavelength.

12. The method according to claim 7, wherein the image processing techniques comprise image pattern recognition and/or image pattern matching.

13. The method according to claim 7, wherein prior to the plasma etch process the substrate comprises the front surface comprising at least two areas having different reflectivity properties.

14. The method according to claim 7, wherein the substrate comprises a mask layer partially covering a material to be etched, and the mask layer has a different reflectivity property to the material to be etched.

15. The method according to claim 14, wherein the mask layer covers at least 90% of the material to be etched.

16. The method according to claim 7, wherein step (c) comprises applying image processing techniques to a reference image taken by the camera to identify the location of the at least one feature; measuring a reference reflectivity signal at the location of the at least one feature in the reference image; and comparing the reference reflectivity signal with a reflectivity signal measured at the location of the at least one feature on successive images.

17. The method according to claim 7, wherein identifying the location of the at least one feature comprises locating a reference pattern and determining the location of the at least one feature relative to a location of the reference pattern.

18. The method according to claim 7, wherein the reflectivity signal is a brightness signal, an intensity, and/or a colour of reflected light.

19. The method according to claim 7, wherein step (d) comprises terminating the plasma etch process in response to a change in the reflectivity signal at the location.

20. The method according to claim 7, wherein the at least one feature is a via, a copper plug embedded in a silicon substrate, or a trench, and wherein the substrate is a wafer, a wafer on a carrier structure, or a wafer attached by tape to a frame.

* * * * *